(12) United States Patent
Nakafuku

(10) Patent No.: US 6,414,569 B1
(45) Date of Patent: Jul. 2, 2002

(54) METHOD OF ADJUSTING FREQUENCY OF PIEZOELECTRIC RESONANCE ELEMENT BY REMOVING MATERIAL FROM A THICKER ELECTRODE OR ADDING, MATERIAL TO A THINNER ELECTRODE

(75) Inventor: Sachihito Nakafuku, Toyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/695,785

(22) Filed: Oct. 25, 2000

(30) Foreign Application Priority Data

Nov. 1, 1999 (JP) ............................................. 11-311302
Jul. 26, 2000 (JP) ........................................ 2000-226072

(51) Int. Cl.[7] .............................. H03H 9/54; H03H 9/15
(52) U.S. Cl. ........................ 333/188; 333/197; 310/312; 29/25.35
(58) Field of Search ................................ 333/186–192; 310/312; 29/25.35

(56) References Cited

U.S. PATENT DOCUMENTS

| | | | | |
|---|---|---|---|---|
| 3,549,414 A | * | 12/1970 | Curran et al. ........... 333/188 X |
| 3,760,471 A | * | 9/1973 | Böner ...................... 29/25.35 |
| 5,404,628 A | * | 4/1995 | Ketcham ................... 29/25.35 |
| 5,407,525 A | * | 4/1995 | Michel et al. .............. 156/627 |
| 5,630,949 A | * | 5/1997 | Lakin ........................... 216/61 |
| 5,662,782 A | * | 9/1997 | Gomi et al. ........... 204/192.34 |
| 5,780,713 A | * | 7/1998 | Ruby .......................... 73/1.82 |
| 5,894,647 A | * | 4/1999 | Lakin ........................ 29/25.35 |
| 6,051,907 A | * | 4/2000 | Ylilammi ..................... 310/312 |
| 6,249,074 B1 | * | 6/2001 | Zimnicki et al. ........... 310/312 |
| 6,307,447 B1 | * | 10/2001 | Barber et al. ............... 333/189 |

FOREIGN PATENT DOCUMENTS

JP       10-126187     5/1998
WO    WO 98/15984   * 4/1998

* cited by examiner

Primary Examiner—Robert Pascal
Assistant Examiner—Barbara Summons
(74) Attorney, Agent, or Firm—Keating & Bennett, LLP

(57) ABSTRACT

A method of adjusting a frequency of an energy-trap type piezoelectric resonance element includes the steps of preparing a piezoelectric resonance element including first and second vibration electrodes formed partially on both of the main surfaces of a piezoelectric plate, the thickness of the first vibration electrode being larger than that of the second vibration electrode, and modifying the first vibration electrode or the second vibration electrode in such a manner that the thicknesses of the first and second vibration electrode electrodes are substantially equal to each other such that the piezoelectric resonance element has a desired frequency.

17 Claims, 6 Drawing Sheets

METHOD OF ADJUSTING FREQUENCY OF PIEZOELECTRIC RESONANCE ELEMENT BY REMOVING MATERIAL FROM A THICKER ELECTRODE OR ADDING, MATERIAL TO A THINNER ELECTRODE

BACKGROUND OF THE INVENTION

1. Field of the Invention

The present invention relates to a method of adjusting a frequency of an energy-trap type piezoelectric resonance element which utilizes, for example, a thickness extensional vibration mode, a thickness slide vibration mode, or other vibration modes, and more particularly, the present invention relates to a method of adjusting a frequency of an energy-trap type piezoelectric resonance element by controlling the thickness of a vibration electrode.

2. Description of the Related Art

Conventionally, energy-trap type piezoelectric resonance elements have been used for piezoelectric oscillators, piezoelectric filters, and other electronic components. For such a piezoelectric resonance element, it is necessary to minimize variations in resonance frequency and center frequency.

In the manufacture of the above-mentioned piezoelectric resonance element, vibration electrodes are formed in a matrix pattern on the upper surface and lower surface of a piezoelectric mother substrate. The piezoelectric substrate is cut to produce individual piezoelectric resonance elements. However, there has been the tendency for the resonance frequency and the center frequency to change depending on different piezoelectric mother substrates. Moreover, for different individual piezoelectric resonance substrates, even if they are formed from the same piezoelectric resonance mother substrate, the frequencies tend to be different from each other.

For this reason, conventionally, a variety of methods of adjusting the frequency of a piezoelectric resonance element have been proposed.

For example, Japanese Unexamined Patent Application Publication 10-126187 discloses a method of adjusting the frequency of a quartz oscillator. In this method, electrode films having the same thickness depending on a target frequency are formed on both of the main surfaces of a quartz plate. When a frequency is measured and is determined to be higher than the target frequency, an electrode material is added to one of the vibration electrodes to increase the thickness of the electrode to adjust the frequency. If the frequency is lower than the target frequency, a portion of the electrode is removed so as to reduce the thickness of the electrode to adjust the frequency.

However, in the case in which an electrode material is added to one of the vibration electrodes formed on the main surfaces of a piezoelectric plate, or the electrode material is removed so as to reduce the electrode thickness for adjustment of the frequency, the thicknesses of the electrodes formed on the main surfaces become significantly different from each other. Thus, there arises the problem that the electrical characteristics of the component are significantly deteriorated, and an undesirable ripple occurs in a frequency characteristic, due to the difference in thickness of the vibration electrodes formed on both main surfaces of the piezoelectric plate.

SUMMARY OF THE INVENTION

In order to overcome the problems described above, preferred embodiments of the present invention provide a method of adjusting a frequency of a piezoelectric resonance element which prevents deterioration of the electrical characteristics and generation of undesirable ripples caused by conventional frequency adjustment methods, such that the frequency of the novel piezoelectric resonance element is highly accurately controlled to achieve a target frequency.

According to a preferred embodiment of the present invention, a method of adjusting a frequency of an energy-trap type piezoelectric resonance element includes the steps of preparing a piezoelectric resonance element including a piezoelectric plate, first and second vibration electrodes formed partially on both of the main surfaces of the piezoelectric plate and opposed to each other with the piezoelectric plate located therebetween, the thickness of the first vibration electrode being larger than that of the second vibration electrode, and processing the first vibration electrode or the second vibration electrode so that the thicknesses of the first and second vibration electrode electrodes are closer to each other, and so that the piezoelectric resonance element has a desired frequency.

Preferably, an electrode film made of metal is formed on the second vibration electrode in the electrode processing step, such that the thickness of the second vibration electrode is increased.

Also preferably, in the electrode processing step, the processing is carried out in such a manner that the thickness of the first vibration electrode is decreased.

Preferably, the method further includes the step of measuring the resonance frequency of the piezoelectric resonator after the step of preparing the piezoelectric resonance element, and the processing is carried out in such a manner that when the resonance frequency is higher than a desired frequency, the thickness of the second vibration electrode is increased, and when the resonance frequency of the piezoelectric resonance element is lower than the desired frequency, the thickness of the first vibration electrode is decreased.

The difference in thickness between the first and second vibration electrodes prior to the electrode processing step is preferably up to about 0.3 $\mu$m.

Also preferably, the piezoelectric resonance element further includes first and second lead-out electrodes, and first and second terminal electrodes connected to the first and second lead-out electrodes, formed on both of the main surfaces of the piezoelectric plate, respectively. The first lead-out electrode and the first vibration electrode preferably have a substantially equal thickness, and the second lead-out electrode and the second vibration electrode preferably have a substantially equal thickness, prior to the processing step. During the processing step, the first or second lead-out electrodes are processed together with the first or second vibration electrode in such a manner that the thicknesses of the first and second lead-out electrodes become closer to each other.

Other features, elements, characteristics and advantages of preferred embodiments of the present invention will become apparent from the following detailed description of preferred embodiments thereof with reference to the attached drawings.

DETAILED DESCRIPTION OF PREFERRED EMBODIMENTS

Figure 1:
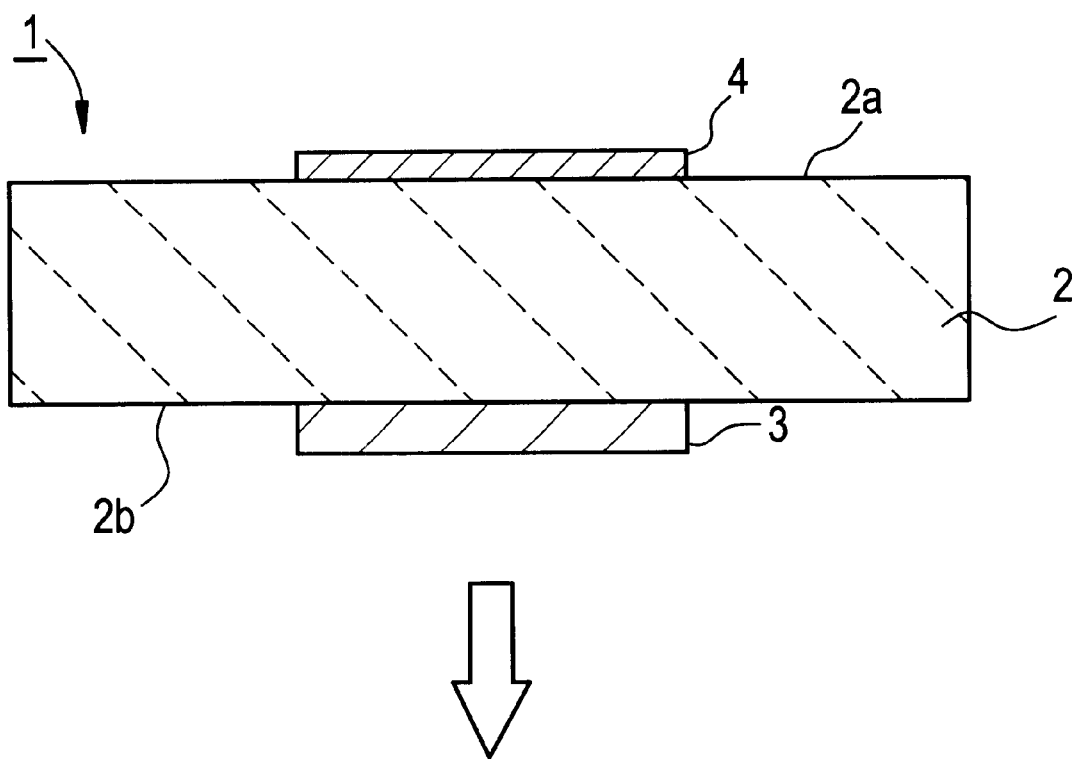
FIG. 1 is a schematic cross-sectional view illustrating a method of adjusting the frequency of a piezoelectric resonance element according to a first preferred embodiment of the present invention.
Figure 1:
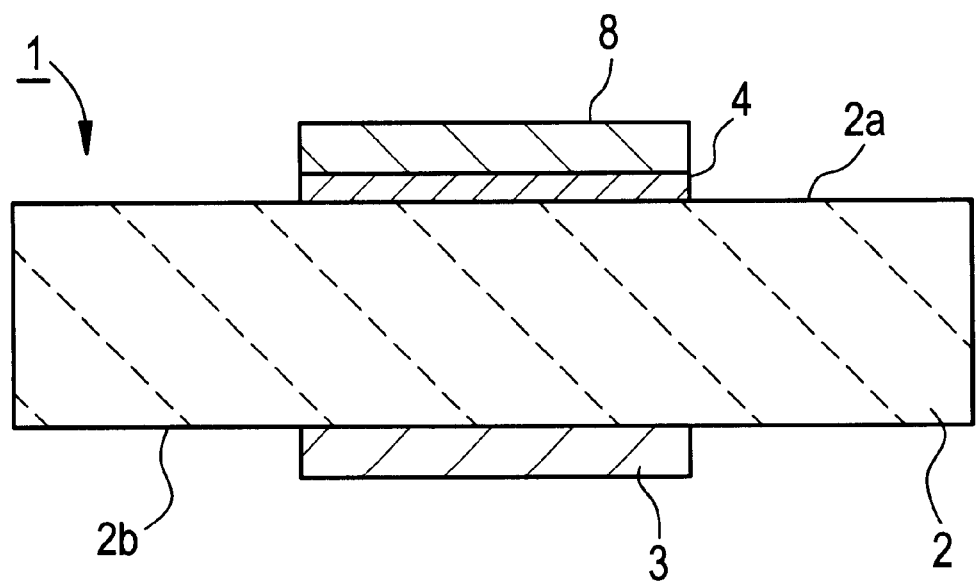

FIG. 1 is a cross-sectional view showing a preferred embodiment of a method of adjusting a frequency of a piezoelectric resonance element according to the present invention.

In this preferred embodiment, an energy-trap type piezoelectric resonance element 1 is prepared. The energy-trap type piezoelectric resonance element 1 preferably includes a piezoelectric plate 2 formed from a piezoelectric ceramic such as a lead titanate zirconate type ceramic. A first vibration electrode 3 is located on the lower surface of the piezoelectric plate 2, and a second vibration electrode 4 is located on the upper surface thereof. The first and second vibration electrodes 3 and 4 are arranged in such a manner that the front and back surfaces thereof are opposed to each other.

Figure 2:
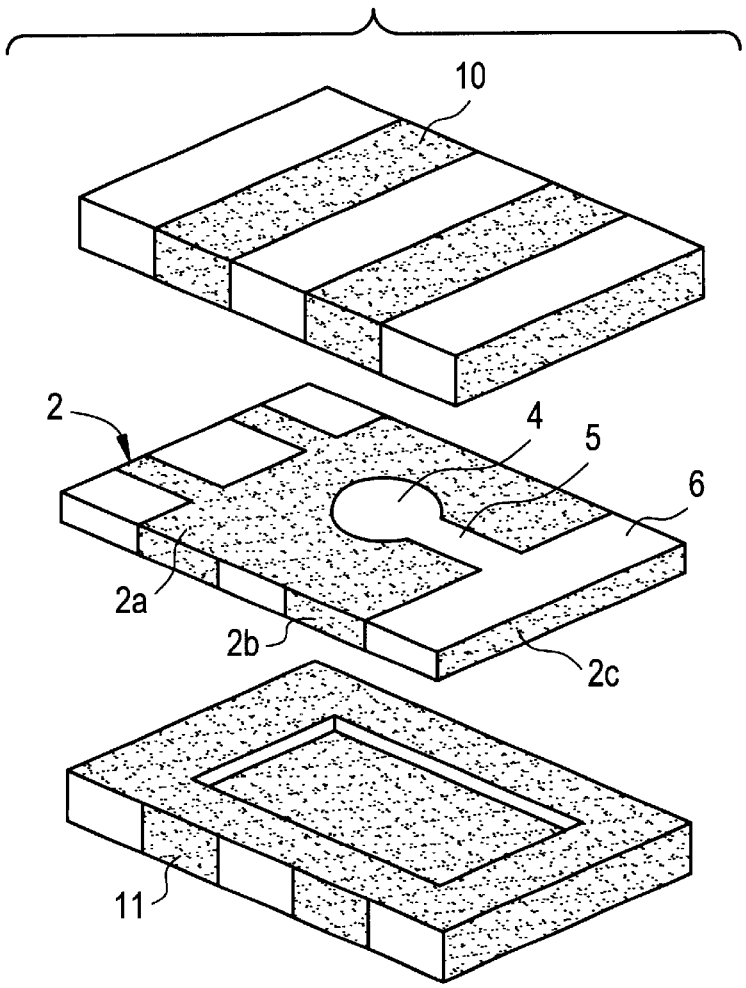
FIG. 2 is an exploded perspective view of a piezoelectric resonance component including the piezoelectric resonance element for which the frequency adjustment is carried out according to the first preferred embodiment of the present invention.

FIG. 1 schematically shows the piezoelectric resonance element 1. The piezoelectric resonance element 1 has the structure shown in FIG. 2. FIG. 2 is an exploded perspective view of a piezoelectric resonance component including the above-described piezoelectric resonance element 1. In the piezoelectric resonance element 1, not only the second vibration electrode 4 but also a second lead-out electrode 5 is located on the upper surface 2a of the piezoelectric plate 2. The outer side-end of the second lead-out electrode 5 is electrically connected to a terminal electrode 6. The terminal electrode 6 extends along a side-edge 2c of the piezoelectric plate 2. Similarly, on the lower surface of the piezoelectric plate 2, a first lead-out electrode and a terminal electrode are arranged so as to be connected to the first vibration electrode 3 shown in FIG. 1. The first terminal electrode extends out to the side-edge on the lower surface 2b of the piezoelectric plate 2, which is opposite to the above-mentioned side-edge 2c.

One of the novel characteristics of this preferred embodiment lies in that the above-mentioned first vibration electrode 3 and the second vibration electrode 4 are previously made to have different thicknesses. That is, the first and second vibration electrodes 3 and 4 are formed in such a manner that the thickness of the first vibration electrode 3 is larger than that of the second vibration electrode 4.

The first and second vibration electrodes 3 and 4, the above-described lead-out electrode 5, the terminal electrode 6, and other electrode elements may be formed by vapor depositing or sputtering an appropriate metallic material such as Ag, an Ag—Pd alloy, or other suitable processes. In the configuration of this preferred embodiment, the first vibration electrode 3 is preferably made of Ag, and has a thickness of about 0.6 $\mu$m. The second vibration electrode 4 is preferably made of Ag, and has a thickness of about 0.3 $\mu$m.

Examples of a method of providing different thicknesses for the first and second vibration electrodes 3 and 4 include applying different electric powers to targets disposed on the upper and lower surfaces or the right and left sides of the piezoelectric plate 2 when the vibration electrodes 3 and 4 are formed, e.g., by use of sputtering or other suitable process.

Furthermore, the thickness of the first vibration electrode 3 may be increased by first forming an Ag film on the upper surface 2a and the lower surface 2b of the piezoelectric plate 2 so as to have a substantially equal thickness, and thereafter, further forming an Ag film only on the lower surface 2b.

Next, according to another preferred embodiment of the present invention, the resonance frequency of the above-described piezoelectric resonance element 1 is measured. The piezoelectric resonance element 1 is previously formed in such a manner that the measured resonance frequency is higher than a target frequency.

Next, since the resonance frequency actually measured is higher than the target frequency, an Ag film 8 defining an electrode film is formed on the second vibration electrode 4, as shown in the lower portion of FIG. 1. That is, the piezoelectric resonance element 1 is adjusted so that the resonance frequency is reduced by forming the Ag film 8 and the resultant mass addition effect of the Ag film. Accordingly, by forming the Ag film 8 in a manner corresponding to a difference in resonance frequency between the piezoelectric resonance element 1 actually measured prior to the frequency adjustment and the target frequency, the frequency adjustment is carried out so that the piezoelectric resonance element 1 has a resonance frequency that is substantially equal to the target frequency after the frequency adjustment.

In the piezoelectric resonance element 1 produced as described above, the Ag film 8 is formed on the second vibration electrode 4 so that the thickness of the second vibration electrode 4 approaches that of the first vibration electrode 3. Thus, the difference in thickness between the vibration electrodes located on both of the main surfaces, obtained after the frequency adjustment is minimized.

Accordingly, generation of undesirable ripples is effectively prevented as described later. Moreover, the quantity by which the frequency is adjustable is about two times that of the conventional example. In particular, according to the conventional method of adjusting a frequency of a piezoelectric resonance element, vibration electrodes having a substantially equal thickness are previously formed on both of the main surfaces. Accordingly, if the difference in thickness between the vibration electrodes on both of the main surfaces is increased by the frequency adjustment, undesirable ripples are generated as described later. On the other hand, in this preferred embodiment, the thickness of the second vibration electrode 4 is previously reduced. Accordingly, the frequency can be adjusted while generation of undesirable ripples is prevented. Thus, the quantity by which the frequency can be adjusted without generation of ripples is doubled.

Next, the present invention will be more specifically described with reference to an experimental example.

A mother substrate made of lead titanate zirconate type piezoelectric ceramic, having an approximate size of 20 mm×30 mm×0.15 mm thick, is provided. A plurality of the second vibration electrodes 4 each having a thickness of about 0.3 $\mu$m are formed on the upper surface of the mother substrate, and a plurality of the first vibration electrodes 3 each made of an Ag film, having a thickness of about 0.6 $\mu$m are formed on the lower surface, by sputtering to form the Ag films. The plan shapes of the first and second vibration electrodes are substantially circular each having a diameter of about 0.6 mm as shown in FIG. 2. The lead-out electrodes and the terminal electrodes were formed on the upper surface and the lower surface of the mother substrate. That is, the lead-out electrode 5 and the terminal electrode 6 located on the upper surface 2a of the piezoelectric plate 2 each had substantially the same thickness as that of the second vibration electrode 4. The lead-out electrode and the terminal electrode located on the lower surface 2b of the piezoelectric plate 2 had substantially the same thickness of that of the first vibration electrode 3.

Figure 4:
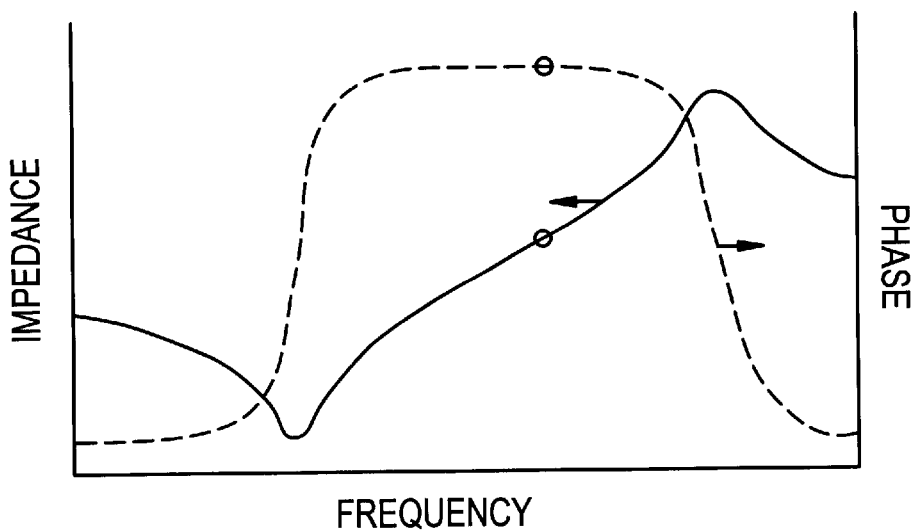
FIG. 4 is a graph showing impedance and phase-frequency characteristics of the piezoelectric resonance element of the first preferred embodiment, obtained prior to the frequency adjustment, in a specific experimental example.

Sealing substrates are bonded to the upper surface and the lower surface of the mother substrate having the electrode patterns formed as described above. Thereafter, the bonded substrates are cut to form an angular sheet-shaped piezoelectric resonance element 1 with an approximate size of 2×3 mm. FIG. 4 shows the impedance and phase-frequency characteristics of the piezoelectric resonance element 1.

Figure 5:
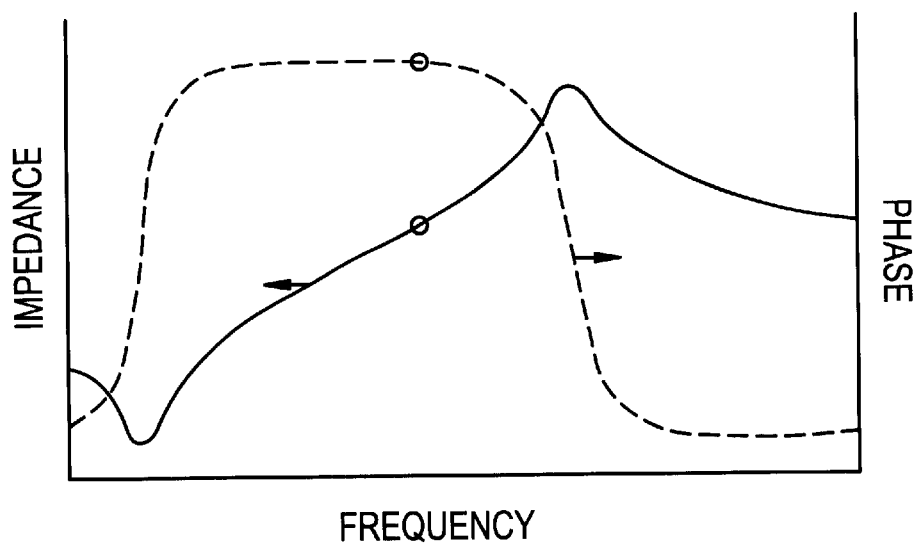
FIG. 5 is a graph showing impedance and phase-frequency characteristics of the piezoelectric resonance element of the first preferred embodiment, obtained after the frequency adjustment in specific experimental example.

In the step of providing the above-described mother substrate, an Ag film having a film thickness of about 0.3 $\mu$m is further formed on the second vibration electrode 4, the second lead-out electrode 5, and the terminal electrode 6, provided on the upper surface of the piezoelectric resonance element 1. Thereafter, the above-procedures are repeated to obtain the piezoelectric resonance element. That is, the frequency adjustment is carried out by decreasing the resonance frequency. FIG. 5 shows the impedance and phase-frequency characteristics of the piezoelectric resonance element 1, obtained after the frequency adjustment.

By comparing FIG. 4 with FIG. 5, it is clearly understood that the resonance frequency is decreased, and undesirable ripples are scarcely generated in a frequency band, with the method of preferred embodiments of the present invention.

Figure 6:
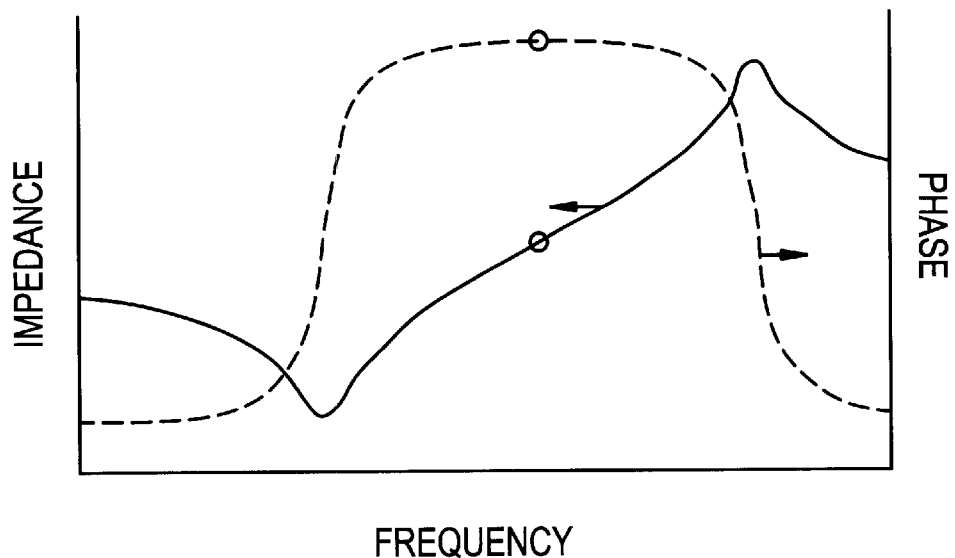
FIG. 6 is a graph showing impedance and phase-frequency characteristics of a piezoelectric resonance element prepared for comparison to preferred embodiments of the present invention, obtained after the frequency adjustment.
Figure 7:
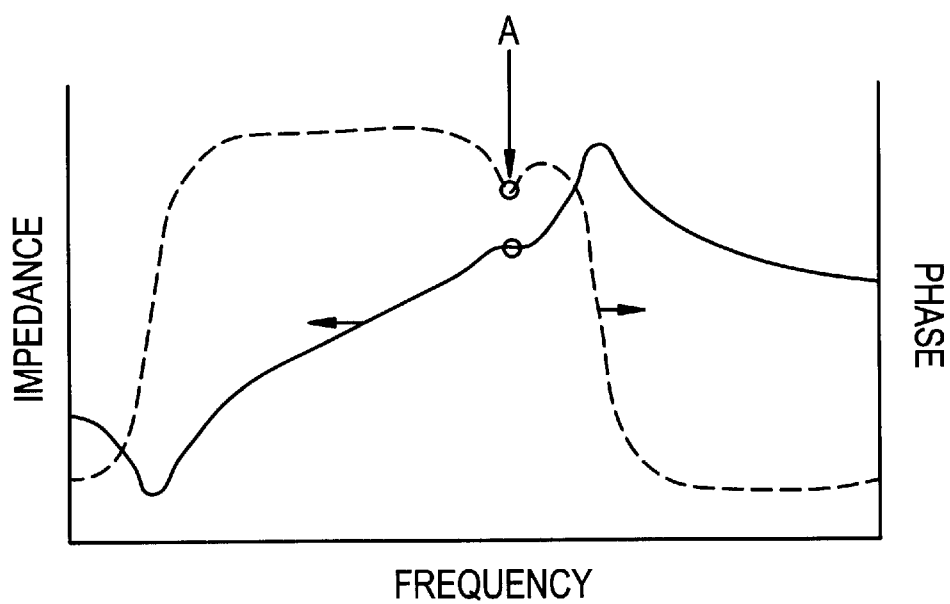
FIG. 7 is a graph showing impedance and phase-frequency characteristics of the piezoelectric resonance element prepared for comparison to preferred embodiments of the present invention, obtained by carrying out the frequency adjustment according to a conventional method.

For comparison to the result achieved with preferred embodiments of the present invention, frequency adjustment was carried out according to the conventional method. The results will be described. First, a piezoelectric resonance element having first and second vibration electrodes made of an Ag film, having substantially the same thickness of about 0.3 $\mu$m formed on both of the main surfaces is prepared by using the same piezoelectric plate as that in the above-described preferred embodiment. FIG. 6 shows the impedance and phase-frequency characteristics of the piezoelectric resonance element. On one of the vibration electrodes of the piezoelectric resonance element prepared as described above, an Ag film having a thickness of about 0.6 $\mu$m is formed. That is, the frequency adjustment was carried out by reducing the frequency. FIG. 7 shows the impedance and phase-frequency characteristics of the piezoelectric resonance element, obtained after the frequency adjustment.

As seen in FIG. 7, when the frequency adjustment of the piezoelectric resonance element was carried out according to the conventional method, a large ripple was generated in the pass-band as shown by arrow A. This is caused by the difference in thickness between the vibration electrodes on both of the main surfaces, which thickness was increased by the frequency adjustment.

The comparison of the results shown in FIG. 4 and FIG. 5, and also, those of FIGS. 6 and 7 shows that the frequency adjustment according to this preferred embodiment of the present invention greatly improves the resonance frequency to a target frequency while generation of an undesirable ripple is suppressed.

Figure 8:
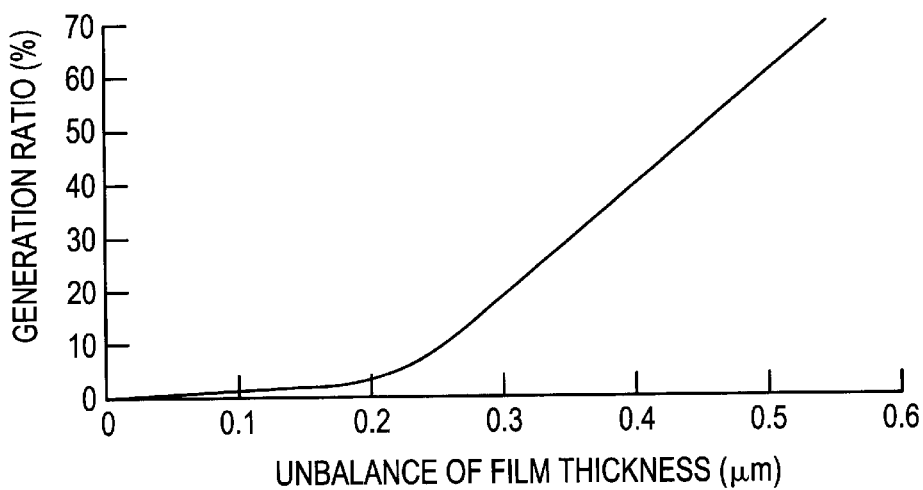
FIG. 8 is a graph showing the relationship between a difference in film thickness between the vibration electrodes disposed on both of the main surfaces, and the generation ratio of ripples in a band.
Figure 9:
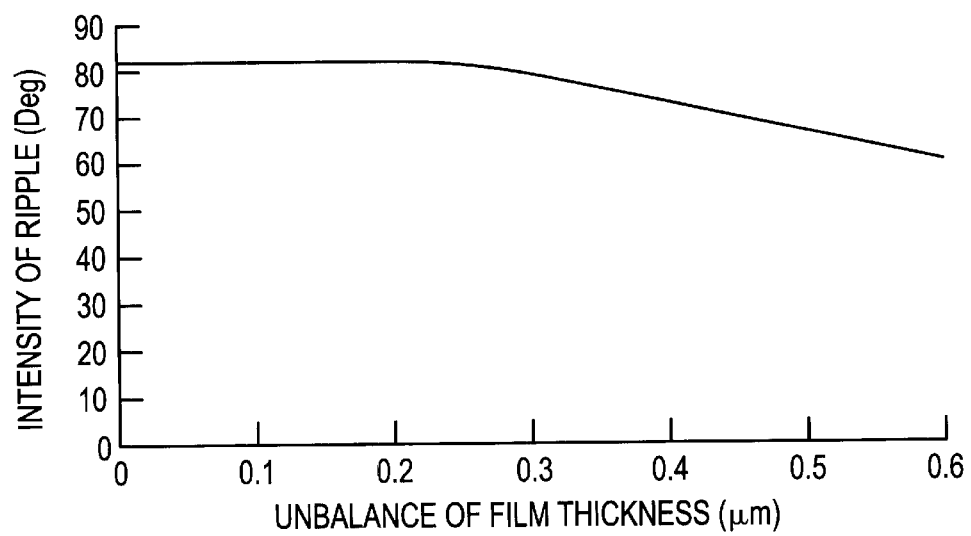
FIG. 9 is a graph showing the relationship of a difference in thickness between the vibration electrodes disposed on both of the main surfaces, and the ripples appearing in a phase characteristic.

In the case of frequency adjustment carried out according to the conventional example, the final difference in film thickness between the vibration electrodes on both of the main surfaces, and the generation ratio of ripples were evaluated. FIGS. 8 and 9 show the results. In FIG. 8, the difference in film thickness of the vibration electrodes on both of the main surfaces is plotted as abscissa, and the generation ratio of ripples as ordinate. In FIG. 9, the difference in film thickness between the vibration electrodes on both of the main surfaces is plotted as abscissa, and the phase value $\theta$ of the portion of the phase characteristic curve in which a ripple is generated is plotted as ordinate. The term of "generation ratio of ripples" means the generation ratio of ripples in the band indicated by the arrow A obtained for 200 piezoelectric resonance elements measured. It is estimated that a ripple is generated when the phase angle is up to 75°.

As seen in FIGS. 8 and 9, in the case of the frequency adjustment carried out according to the conventional method, more ripples A are generated with increase of the difference in film thickness between the vibration electrodes on both of the main surfaces. In other words, it is seen that when the difference in thickness between the vibration electrodes on both of the main surfaces is up to about 0.3 $\mu$m, the generation of ripples can be effectively suppressed.

Accordingly, it is seen that by setting the difference in thickness between the first and second vibration electrodes 3 and 4, obtained before the frequency adjustment, that is, prior to the electrode processing step, to be about 0.3 $\mu$m or less, in the above-described preferred embodiment, the generation of the ripples A after the frequency adjustment is prevented. In particular, the thicknesses of the vibration electrodes 3 and 4 on both of the main surfaces are previously made different in such a manner that the resonance frequency is higher than a target frequency, and the film-thickness difference between the electrodes becomes about 0.3 $\mu$m or less. Thereafter, by increasing the thickness of the second vibration electrode as described in the above preferred embodiment so as to approach that of the first vibration electrode 3 for frequency adjustment, the generation of the ripple A is effectively suppressed.

In the above-described experimental example, when the frequency adjustment was carried out by increasing the thickness of the second vibration electrode 4, the lead-out electrode 5 and the terminal electrode 6 were also processed so that their respective thicknesses were increased. Only the second vibration electrode 4 is processed so as to have an increased thickness.

In the case of a thin-film formation method such as vapor deposition, sputtering, or other method, in which the second vibration electrode 4, the lead-out electrode 5, and the terminal electrode 6 are simultaneously formed on the upper surface 2a of the piezoelectric plate 2, it is preferable from the standpoint of convenience of the electrode processing that not only the vibration electrode 4, but also the lead-out electrode 5 and the terminal electrode 6 are processed by simultaneously increasing the thicknesses.

Figure 3:
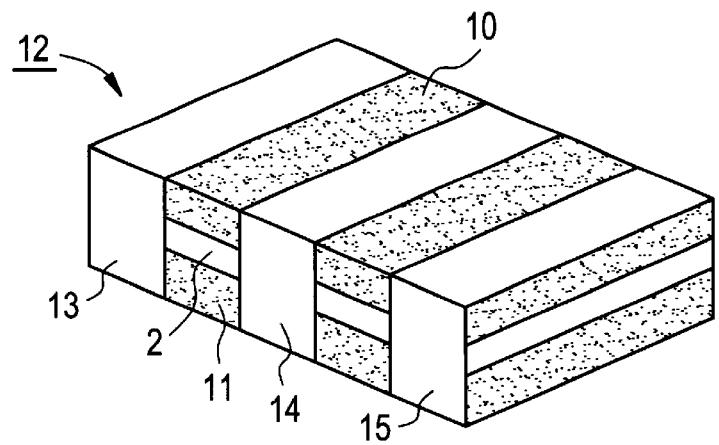
FIG. 3 is a perspective view of a chip piezoelectric resonance component including the piezoelectric resonance element for which the frequency adjustment is carried out according to the first preferred embodiment of the present invention.

The piezoelectric resonance element 1 of this preferred embodiment is constructed to define a piezoelectric resonance component, shown in FIGS. 2 and 3, to constitute an electronic chip component. That is, casing substrates 10 and 11 are laminated on the upper side and the lower side of the piezoelectric resonance element 1. The casing substrates 10 and 11 are made of insulation ceramic such as alumina or other suitable material, or synthetic resin.

In a piezoelectric resonance chip component 12 finally obtained as shown in FIG. 3, external electrodes 13 to 15 are disposed formed so as to cover both of the end surfaces, respectively.

Figure 10:
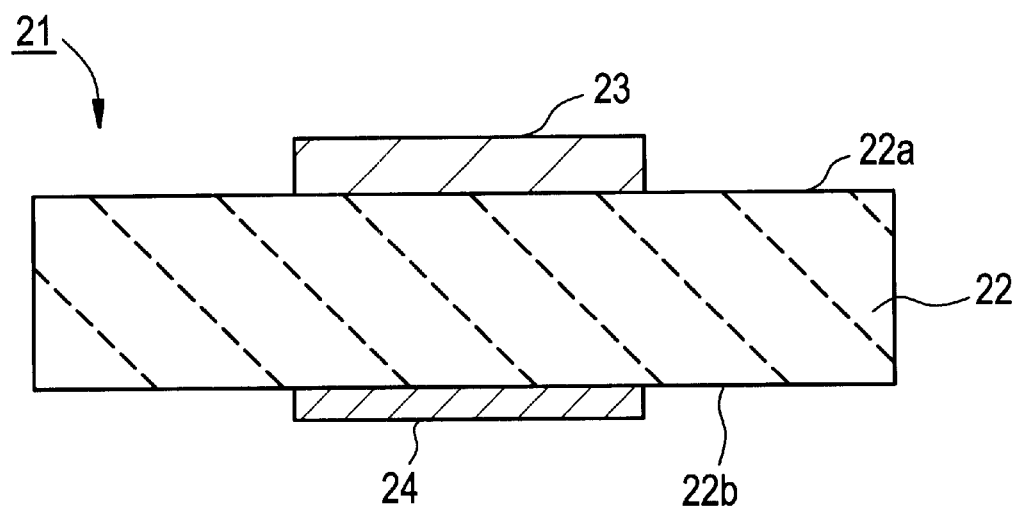
FIG. 10 is a schematic cross-sectional view illustrating a method of adjusting a frequency of a piezoelectric resonance element according to a second preferred embodiment of the present invention.
Figure 10:
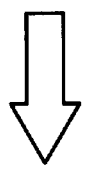
Figure 10:
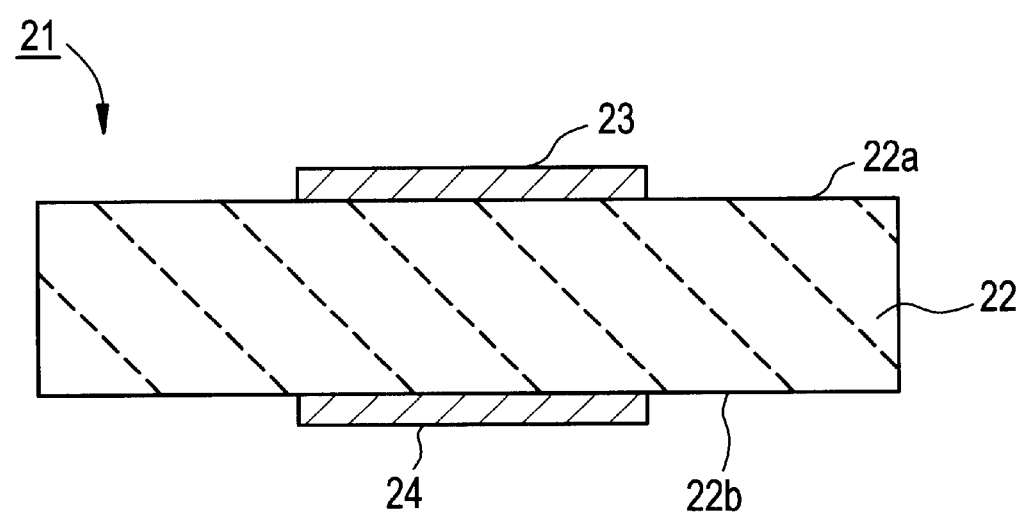

FIG. 10 is a schematic cross-sectional view illustrating a method of adjusting a frequency of a piezoelectric resonance element according to a second preferred embodiment of the present invention.

In the first preferred embodiment, the frequency adjustment is carried out preferably by forming an electrode film made of metal on the second vibration electrode which is thinner than the first vibration electrode, that is, by increasing the thickness of the second vibration electrode. On the contrary, according to other preferred embodiments of the present invention, the frequency adjustment may be carried out by processing the first vibration electrode so as to reduce the thickness.

That is, as shown in FIG. 10, a piezoelectric resonance element 21 is prepared. In the piezoelectric resonance element 21, a first vibration electrode 23 is located on the upper surface 22a of a piezoelectric plate 22, and a second vibration electrode 24 is located on the lower surface 22b thereof. In the piezoelectric resonance element 21, a lead-out electrode and a terminal element are arranged similarly to the piezoelectric resonance element 1 shown in FIG. 2. The piezoelectric resonance element plate 22 is polarization-treated in the thickness direction. Thus, an energy-trap type piezoelectric resonator utilizing a thickness extensional vibration mode is provided.

The thickness of the first vibration electrode 23 is preferably larger than that of the second vibration electrode 24.

For frequency adjustment, a portion of the first vibration electrode is removed by a laser, ion beams, sputtering, etching, or other suitable method to decrease the thickness of the first vibration electrode 23, approaching that of the second vibration electrode 24. Thus, the frequency adjustment is carried out so that the resonance frequency is increased.

In the second preferred embodiment, the thickness of the first vibration electrode 23 is preferably previously set to be larger than that of the second vibration electrode 24. When the thickness of the electrode film is reduced for frequency adjustment as described above, the thicknesses of the first and second vibration electrodes approach to each other and are substantially equal to each other. Thus, unnecessary ripples are effectively prevented.

In the third preferred embodiment, as well as in the first preferred embodiment, an energy-trap piezoelectric resonance element 1 shown in FIG. 1 is prepared. In this preferred embodiment, the first and second vibration electrodes 3 and 4 are formed in such a manner that the thickness of the first vibration electrode 3 is larger than that of the second vibration electrode 4, similarly to the first preferred embodiment.

Next, the resonance frequency of the piezoelectric resonance element 1 prepared as described above is measured, similarly to the first preferred embodiment. In the first preferred embodiment, the piezoelectric resonance element 1 is formed so as to have a resonance frequency higher than a target frequency. On the other hand, in the third preferred embodiment, the measured frequency may be higher or lower than the target frequency.

In the third preferred embodiment, in the case in which the resonance frequency of the piezoelectric resonance element 1 actually measured is higher than the target frequency, the electrode processing is carried out similarly to the first preferred embodiment. That is, the frequency adjustment is carried out by forming an Ag film 8 so that the resonance frequency is reduced and so that the resonance frequency reaches the target frequency, which is achieved by the mass addition effect of the Ag film 8.

On the other hand, when the resonance frequency actually measured is lower than the target frequency, the electrode processing is carried out in such a manner that the thickness of the first vibration electrode which is relatively thick is reduced, in this preferred embodiment. The electrode processing is carried out similarly to that in the above-described second preferred embodiment, and thereby, the resonance frequency of the piezoelectric resonance element is increased to reach the target frequency for frequency adjustment.

Accordingly, in the third preferred embodiment, whether the resonance frequency of the piezoelectric resonance element 1 actually measured is higher or lower than a target frequency, the resonance frequency of the piezoelectric resonance element is accurately and precisely controlled to reach the target frequency by carrying out the electrode processing as described in the first preferred embodiment or that as in the second preferred embodiment.

In the first to third preferred embodiments, an energy-trap type piezoelectric resonator utilizing a thickness extensional vibration mode is described. The method of adjusting a frequency of a piezoelectric resonance element of the present invention may utilize another vibration mode such as a thickness slide mode. Furthermore, the method of adjusting a frequency of various preferred embodiments of the present invention may be applied not only to the piezoelectric resonance element but also to another piezoelectric resonance element such as a piezoelectric filter or other component.

According to the method of adjusting a frequency of an energy-trap type piezoelectric resonance element of various preferred embodiments of the present invention, a piezoelectric resonance element in which the thickness of a first vibration electrode is larger than that of a second vibration electrode is prepared, and the frequency is adjusted by processing the first vibration electrode or the second vibration electrode in such a manner that the thicknesses of the first and second vibration electrode electrodes approach to each other, and the element achieves a desired frequency.

The thicknesses of the first and second vibration electrodes, obtained after the frequency adjustment, are very close to each other. Thus, ripples in a band are effectively minimized in the piezoelectric resonance element of which the frequency is adjusted to a target frequency. Accordingly, a piezoelectric resonance element with excellent electrical characteristics is provided.

Preferably, an electrode film made of metal is formed on the second vibration electrode in the electrode processing step, whereby the thickness of the second vibration electrode is increased. In this case, the frequency adjustment can be carried out so as to reduce the frequency of the resonator.

On the contrary, when the electrode processing is carried out to reduce the thickness of the first vibration electrode, the frequency adjustment is carried out so as to increase the frequency of the resonator.

Preferably, according to preferred embodiments of the present invention, the resonance frequency of the prepared piezoelectric resonance element is measured. The electrode processing is carried out in such a manner that when the resonance frequency is higher than a desired frequency, the thickness of the second vibration electrode is increased, and when the resonance frequency of the piezoelectric resonance element is lower than the desired frequency, the thickness of the first vibration electrode is decreased. Accordingly, whether the resonance frequency of the piezoelectric resonance element actually measured is higher or lower than a target frequency, the resonance frequency of the piezoelectric resonance element can be securely adjusted to the target frequency.

Accordingly, when the piezoelectric resonance element is prepared, it is unnecessary to set the resonance frequency of the piezoelectric resonance element so that the frequency is higher or lower than a target frequency. Thus, restrictions in the step of preparing the piezoelectric resonance element can be reduced. In addition, the working quantities of the first and second vibration electrodes in both of the step of increasing the thickness of the second vibration electrode and the step of decreasing the thickness of the first vibration electrode can be minimized, respectively. That is, electrode material costs are greatly reduced. When the piezoelectric substrate is made of piezoelectric ceramic, the thickness of an electrode is large, as compared with that formed on a piezoelectric substrate made of quartz. Accordingly, it is expected that the above-described cost-saving effect for an electrode material is greater.

Further, when the difference in thickness between the first and second vibration electrodes prior to the electrode processing step is up to about 0.3 μm, generation of unnecessary ripples in a band are more effectively minimized, as seen in the above experimental example. That is, a piezoelectric resonator with excellent electrical characteristics can be securely provided.

When the piezoelectric resonance element is provided with the first and second lead-out electrodes and the first and second terminal electrodes, and moreover, when the first or second lead-out electrode is processed so that the thicknesses of the first and second lead-out electrodes approach to each other, the first or second lead-out electrode can be processed together with the first or second vibration electrode in the step of processing the first or second vibration electrode. Accordingly, as compared with the processing of one of the first and second vibration electrodes, the electrode processing for achieving frequency adjustment can be easily achieved.

It should be understood that the foregoing description is only illustrative of preferred embodiments of the present invention. Various alternatives and modifications can be devised by those skilled in the art without departing from the present invention. Accordingly, the present invention is intended to embrace all such alternatives, modifications and variations that fall within the scope of the appended claims.

What is claimed is:

1. A method of adjusting a frequency of an electronic component, comprising the steps of:

preparing a piezoelectric resonance element including a piezoelectric plate having two main surfaces, first and second vibration electrodes formed partially on both of the main surfaces of the piezoelectric plate, and opposed to each other with the piezoelectric plate disposed therebetween, the thickness of the first vibration electrode being larger than that of the second vibration electrode;

processing at least one of the first vibration electrode and the second vibration electrode so that the thicknesses of the first and second vibration electrodes become closer to each other, and such that the piezoelectric resonance element has a desired frequency; and measuring the resonance frequency of the piezoelectric resonator after the step of preparing the piezoelectric resonance element; wherein the processing step is carried out in such a manner that when the resonance frequency is higher than a desired frequency, the thickness of the second vibration electrode is increased, and when the resonance frequency of the piezoelectric resonance element is lower than the desired frequency, the thickness of the first vibration electrode is decreased.

2. A method according to claim 1, wherein the processing step includes a step of forming an electrode film made of metal on the second vibration electrode such that the thickness of the second vibration electrode is increased.

3. A method according to claim 1, wherein the processing step is carried out in such a manner that the thickness of the first vibration electrode is decreased.

4. A method according to claim 1, wherein after the processing step, the first and second vibration electrodes have the same thickness.

5. A method according to claim 1, wherein the difference in thickness between the first and second vibration electrodes prior to the processing step is equal to or less than about 0.3 μm.

6. A method according to claim 1, wherein the piezoelectric resonance element further comprises first and second lead-out electrodes connected to the first and second vibration electrodes, and first and second terminal electrodes connected to the first and second lead-out electrodes, formed on both of the main surfaces of the piezoelectric plate, respectively, the first lead-out electrode and the first vibration electrode have a substantially equal thickness, and the second lead-out electrode and the second vibration electrode have a substantially equal thickness, prior to the processing step, and in the processing step, at least one of the first and second lead-out electrodes is processed together with the at least one of the first and second vibration electrodes in such a manner that the thicknesses of the first and second lead-out electrodes are closer to each other.

7. A method according to claim 1 wherein the first and second vibration electrodes are formed by at least one of vapor depositing and sputtering a metallic material.

8. A method according to claim 1, wherein the first vibration electrode is made of Ag and has a thickness of about 0.6 μm before the processing step.

9. A method according to claim 1, wherein the second vibration electrode is made of Ag, and has a thickness of about 0.3 μm before the processing step.

10. A method according to claim 1, wherein in the step of preparing a piezoelectric resonance element, the thickness of the first vibration electrode is increased by first forming an Ag film on the upper surface and the lower surface of the piezoelectric plate so as to have a substantially equal thickness, and thereafter, further forming an Ag film only on the lower surface of the piezoelectric plate.

11. A method according to claim 1, wherein in the step of processing, an Ag film is formed on the second vibration electrode so that the thickness of the second vibration electrode is close to that of the first vibration electrode and such that the thickness of the first and second vibration electrodes is substantially the same.

12. A method according to claim 1, further comprising the step of mounting casing substrates on the upper surface and the lower surface of the piezoelectric plate.

13. A method according to claim 1, wherein the piezoelectric resonance element plate is polarization-treated in the thickness direction thereof to define an energy-trap type piezoelectric resonator utilizing a thickness extensional vibration mode.

14. A method according to claim 1, wherein the step of processing includes the step of performing frequency adjustment by removing a portion of the first vibration electrode.

15. A method according to claim 14, wherein the portion of the first vibration electrode is removed by at least one of a laser, ion beams, sputtering, and etching.

16. A method according to claim 14, wherein the portion of the first vibration electrode is removed to decrease the thickness of the first vibration electrode so that the thickness of the first vibration electrode and the thickness of the second vibration electrode are substantially equal to each other.

17. A method according to claim 1, wherein the electronic component is an energy-trap piezoelectric resonance element.

* * * * *